US008576572B2

(12) United States Patent
Tanaka et al.

(10) Patent No.: US 8,576,572 B2
(45) Date of Patent: Nov. 5, 2013

(54) ELECTRONIC DEVICE

(75) Inventors: Takahiro Tanaka, Yokohama (JP); Mitsuhiro Nishizono, Yokohama (JP); Takumi Ogata, Yokohama (JP); Tadashi Koyama, Yokohama (JP)

(73) Assignee: KYOCERA Corporation, Kyoto (JP)

( * ) Notice: Subject to any disclaimer, the term of this patent is extended or adjusted under 35 U.S.C. 154(b) by 250 days.

(21) Appl. No.: 13/218,354

(22) Filed: Aug. 25, 2011

(65) Prior Publication Data

US 2012/0212912 A1 Aug. 23, 2012

(30) Foreign Application Priority Data

Aug. 27, 2010 (JP) ................................ 2010-191458

(51) Int. Cl.
*H05K 1/00* (2006.01)
*H01R 9/00* (2006.01)

(52) U.S. Cl.
USPC ............................ 361/748; 361/749; 361/776

(58) Field of Classification Search
USPC ........................ 361/748, 749, 776; 455/575.7
See application file for complete search history.

(56) References Cited

U.S. PATENT DOCUMENTS

2010/0163630 A1* 7/2010 Ochi et al. .................... 235/492

FOREIGN PATENT DOCUMENTS

JP 2000-101334 4/2000

* cited by examiner

*Primary Examiner* — Ramon Barrera

(57) ABSTRACT

An electronic device is disclosed. The electronic device includes a housing, a circuit board, an antenna, electronic components, and a wiring part. The circuit board is built inside the housing on which an opening is formed. The antenna is facing one surface of the circuit board. Electronic components are disposed at the position facing the antenna through the circuit board, on the other surface of the circuit board, in a state such that the electronic components are not fixed to the circuit board The wiring part passes through the opening of the circuit board, with one end connected to the electronic components on one side of the circuit board and other end connected to the circuit board on the other surface of the circuit board.

10 Claims, 12 Drawing Sheets

ELECTRONIC DEVICE

CROSS-REFERENCE TO RELATED APPLICATION

The present application claims priority under 35 U.S.C. §119 to Japanese Patent Application No. 2010-191458, filed on Aug. 27, 2010, entitled "ELECTRONIC DEVICE". The content of which is incorporated by reference herein in its entirety.

FIELD

Embodiments of the present invention relate to an electronic device comprising an antenna and electronic components.

BACKGROUND

For electronic devices, for example, portable electronic devices such as mobile phones, PDAs, portable navigation devices, mobile electronic devices such as mobile game devices, and fixed electronic devices such as personal computers (PCs), an antenna for performing communications is disposed. Electronic components such as a camera and an input device are also disposed in electronic devices. In Patent Document 1, a description is given regarding an antenna comprising an antenna element and a circuit that processes signals acquired via the antenna element.

Here, for the electronic device, when a high frequency current flows through the antenna, the high frequency current flows through some other electronic components inside the device. Consequently, this high frequency current flowing through the electronic components generates an electric field even for the electronic components, causing the electric field to be output outside the housing, thereby increasing the electric field that reaches users using the electronic device.

In contrast, if the size of the electronic device is increased and the antenna is placed away from the user, it is possible to weaken the electric field reaching the user. However, the current trend is to decrease the size of electronic devices; hence, there are limitations in terms of placing the antenna away from the user. Because of this trend to decrease the size of electronic devices, the disposition position of the antenna and the range in which the board can be disposed is narrow, bringing each component closer.

The electric field generated can be reduced by reducing the output of the electric waves output from the antenna; however, in this case, the communication wave output is reduced.

SUMMARY

In a first embodiment, an electronic device includes a housing, a circuit board, an antenna, electronic components, and a wiring part. The circuit board is built inside the housing on which an opening is formed. The antenna is facing one surface of the circuit board. Electronic components are disposed at the position facing the antenna through the circuit board, on the other surface of the circuit board, in a state such that the electronic components are not fixed to the circuit board The wiring part passes through the opening of the circuit board, with one end connected to the electronic components on one side of the circuit board and other end connected to the circuit board on the other surface of the circuit board.

BRIEF DESCRIPTION OF THE DRAWINGS

Embodiments of the present disclosure are hereinafter described in conjunction with the following figures, wherein like numerals denote like elements. The figures are provided for illustration and depict exemplary embodiments of the present disclosure. The figures are provided to facilitate understanding of the present disclosure without limiting the breadth, scope, scale, or applicability of the present disclosure. The drawings are not necessarily made to scale.

DETAILED DESCRIPTION

The following description is presented to enable a person of ordinary skill in the art to make and use the embodiments of the disclosure. The following detailed description is exemplary in nature and is not intended to limit the disclosure or the application and uses of the embodiments of the disclosure. Descriptions of specific devices, techniques, and applications are provided only as examples. Modifications to the examples described herein will be readily apparent to those of ordinary skill in the art, and the general principles defined herein may be applied to other examples and applications without departing from the spirit and scope of the disclosure. Furthermore, there is no intention to be bound by any expressed or implied theory presented in the preceding field, background, summary or the following detailed description. The present disclosure should be accorded scope consistent with the claims, and not limited to the examples described and shown herein.

Embodiments of the disclosure are described herein in the context of one practical non-limiting application, namely, an information device. Embodiments of the disclosure, however, are not limited to such mobile information devices, and the techniques described herein may also be utilized in other applications. For example, embodiments may be applicable to mobile phones, digital books, digital cameras, electronic game machines, digital music players, personal digital assistance (PDA), personal handy phone system (PHS), lap top computers, and the like.

As would be apparent to one of ordinary skill in the art after reading this description, these are merely examples and the embodiments of the disclosure are not limited to operating in accordance with these examples. Other embodiments may be utilized and structural changes may be made without departing from the scope of the exemplary embodiments of the present disclosure.

The present invention is described in detail below, with reference to the figures. The present invention is not limited by the following explanation. Constituent elements in the following explanation comprise those that can be easily conceived by persons skilled in the art, those that are essentially the same, and those that are within what is called an equal range. A mobile phone terminal is used as an example to describe the electronic device; however, the applicable subject is not limited to mobile phone terminals, and the present invention can be applicable to various devices comprising an input part, such as a PHS (Personal Handyphone System), a PDA, a portable navigation device, a personal computer, and a game device.

Figure 1:
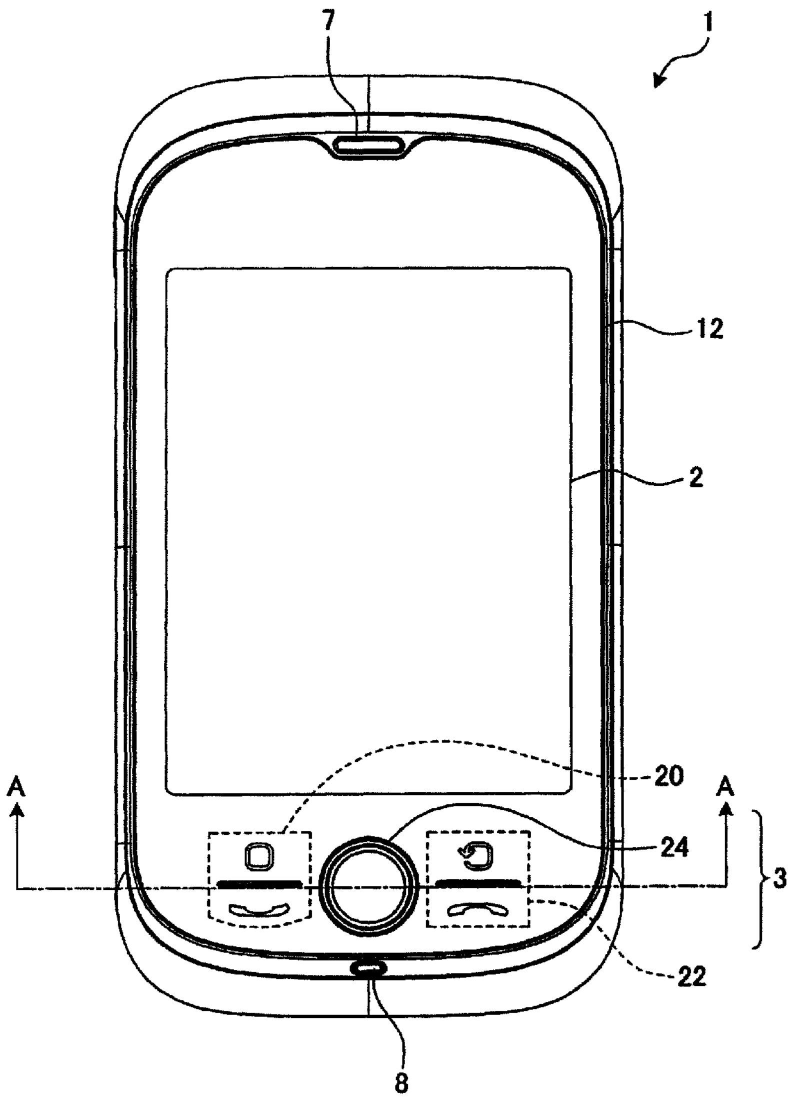
FIG. 1 is a front view showing the external appearance of a mobile phone terminal.
Figure 2:
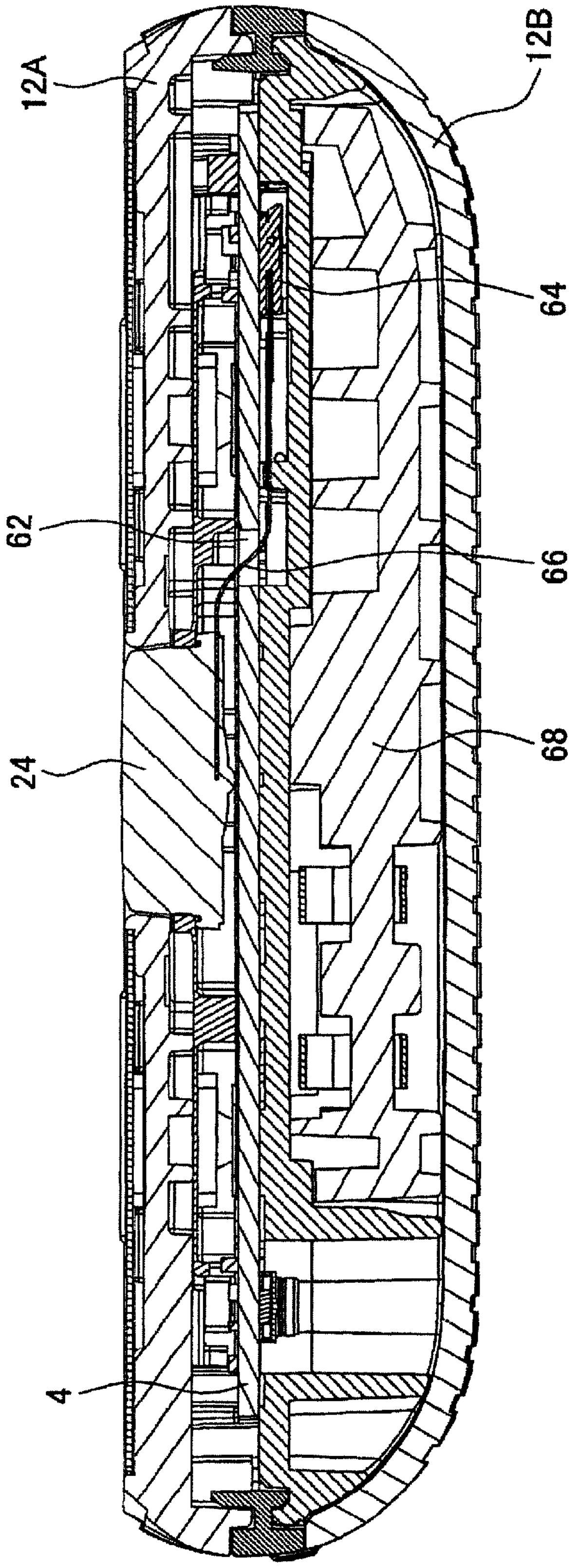
FIG. 2 is a sectional view of the A-A line from FIG. 1.
Figure 3:
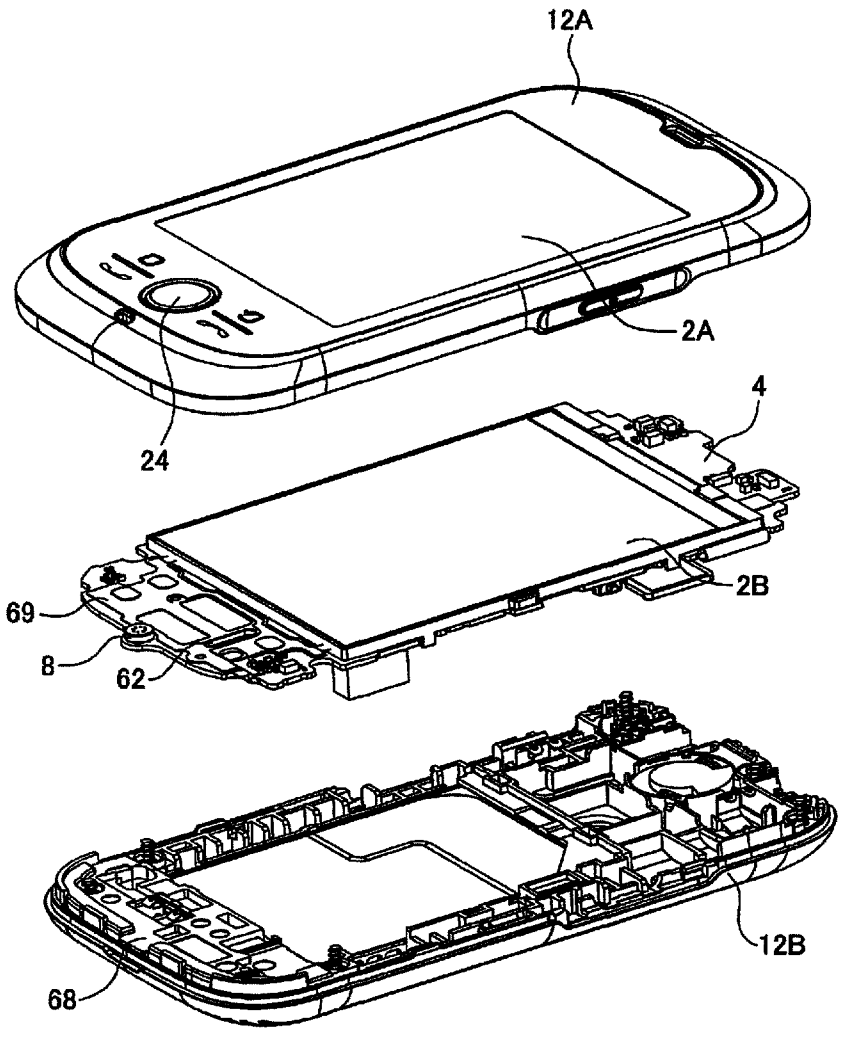
FIG. 3 is an exploded view showing the schematic configuration of the mobile phone terminal from one direction.
Figure 4:
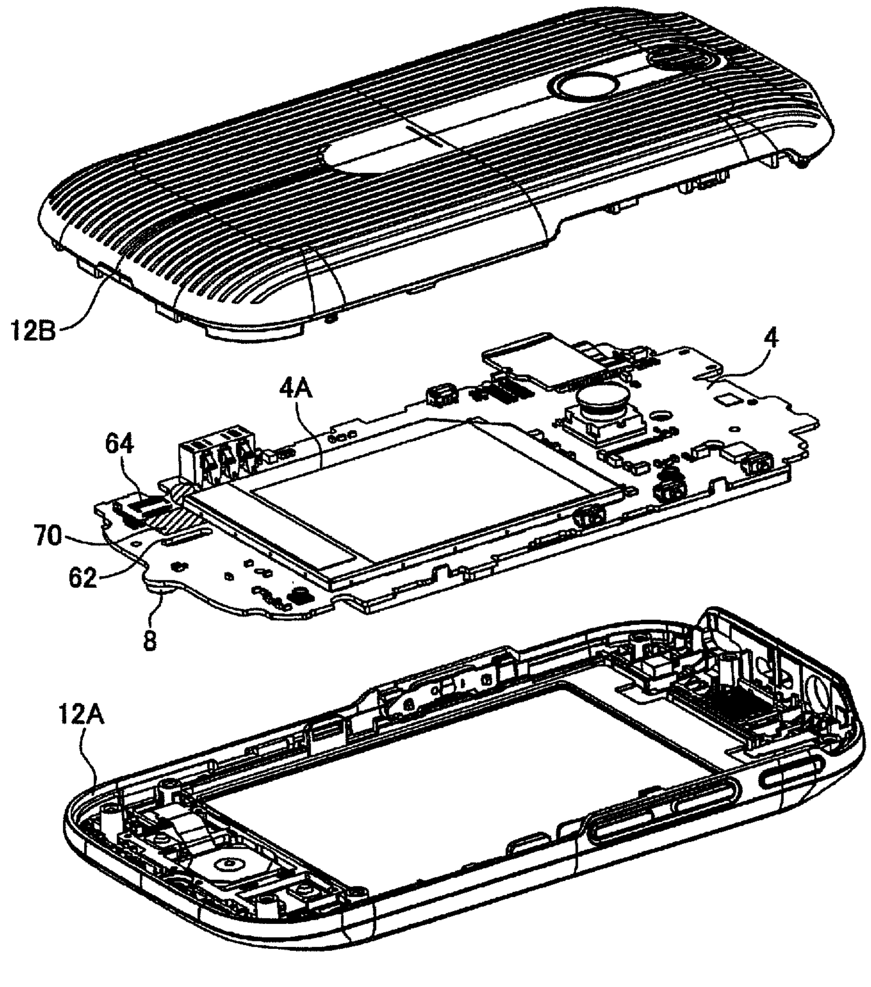
FIG. 4 is an exploded view showing the schematic configuration of the mobile phone terminal from another direction.

FIG. 1 is a front view showing the external appearance of a mobile phone terminal, which is one embodiment of a character input device according to the present invention. FIG. 2 is a sectional view of the A-A line from FIG. 1, FIG. 3 is an exploded view showing the schematic configuration of the mobile phone terminal from one direction, and FIG. 4 is an exploded view showing the schematic configuration of the mobile phone terminal from another direction.

As shown in FIG. 1, a mobile phone terminal 1 comprises a laminated housing 12. As shown in FIG. 2, the housing 12 comprises a first housing 12A and a second housing 12B. The housing 12 is a box-shaped housing with a space formed inside by placing the first housing 12A and the second housing 12B together. Hereinafter, in the present embodiment, the first housing 12A side (the surface on which a touch panel 2 of the first housing 12A is disposed) is referred to as the front face, and the second housing 12B side (the surface of the second housing 12B, which is opposite side from the front face) is referred to as the rear face.

As shown in FIG. 1 and FIG. 2, the touch panel 2; an input part 3 comprising a button 20, a button 22, and an input device 24; a receiver 7; and a microphone 8 are disposed on the surface of the first housing 12A of the mobile phone terminal 1. An opening is formed in the first housing 12A, with the necessary parts for each section, namely the touch panel 2; the input part 3; the receiver 7; and the microphone 8, exposed. For the mobile phone terminal 1, as shown in FIG. 3 and FIG. 4, a board 4 is disposed between the first housing 12A and the second housing 12B. The mobile phone terminal 1 comprises a connector 64; a wiring part 66; an antenna 68; an earth electrode 69; and an earth electrode 70, between the first housing 12A and the second housing 12B. For the mobile phone terminal 1, in addition to the board (circuit board) 4; the connector 64; the wiring part 66; the antenna 68; and the earth electrode 70, a connection terminal connecting each part, or components and devices performing various functions of the mobile phone terminal 1 are also disposed between the first housing 12A and the second housing 12B.

The touch panel 2 is disposed on the surface (front face) with the area of the first housing 12A being the widest. The input part 3 is disposed at the end of one longitudinal side, on the surface on which the touch panel 2 of the first housing 12A is disposed. The input part 3 is disposed in the order of the button 20, the input device 24, and the button 22, from one lateral side in the other direction. The receiver 7 is disposed at the other longitudinal end, on the surface on which the touch panel 2 of the first housing 12A is disposed; that is, it is disposed at the end which is the opposite side from the end on which the input part 3 is disposed. The microphone 8 is disposed at the end of one longitudinal side, on the surface on which the touch panel 2 of the first housing 12A is disposed; that is, it is disposed at the end at which the input part 3 is disposed.

The touch panel 2 displays characters, figures, images, etc., while simultaneously detecting various actions performed with respect to the touch panel 2, using fingers, styluses, pens, (pen tips, the tip of rod-shaped objects), etc., (hereinafter simply referred to as "fingers"). As shown in FIG. 3, the touch panel 2 comprises a touch sensor 2A and a display part 2B that is superposed on the touch sensor 2A. The touch sensor 2A detects contact by the user and the display part 2B displays images. The touch sensor 2A is fixed to the first housing 12A and the display part 2B is fixed to the board 4, which will be described subsequently.

When the buttons 20 and 22 are pressed, the input part 3 starts the functions corresponding to the pressed buttons. The input part 3 also detects the action input to the input device 24 as an operation, and performs various controls, based on the operation that is input. The input device 24 will be described subsequently.

The board (circuit board) 4 is a plate-shaped member and, as shown in FIG. 3 and FIG. 4, the touch panel 2 is disposed on the surface of the first housing 12A side, with a circuit 4A disposed on the surface of the second housing 12B side. Here, the circuit 4A executes each function of the mobile phone terminal 1; therefore, in other words, this serves as an arithmetic part and a storage part for achieving a primary control part; a RAM; a storage part, etc., which will be described subsequently. Regarding the board 4, an opening 62 is formed in the area in which the input device 24 is disposed. In addition to the circuit 4A, various electronic components are disposed on the board 4.

Here, the mobile phone terminal 1 comprises the above connector 64 and the wiring part 66, as mechanisms connecting the circuit 4A disposed on the board 4 to the input device 24. The connector 64, as shown in FIG. 2 and FIG. 4, is disposed in the vicinity of the input device 24, on the surface on the second housing 12B side of the board 4. Specifically, the connector 64 is disposed on an extension line connecting the input device 24 to the opening 62, on the surface of the second housing 12B side of the board 4. The connector 64 is connected to the circuit 4A, transmitting and receiving signals in addition to supplying power.

The wiring part 66 is wiring that connects the input device 24 to the connector 64, transmitting and receiving signals in addition to supplying power. As an example, a flexible printed board, which can substantially change shape, for example, a FPC (Flexible Printed Circuits), can be used as the wiring part 66. A flexible cable can also be used as the wiring part 66. Regarding the wiring part 66, one end is connected to the input device 24, and the other end is connected to the connector 64. The wiring part 66 passes through the opening 62, a section on the input device 24 side is disposed on the first housing 12A side, relative to the board 4, and a section on the connector 64 side is disposed on the second housing 12B side, relative to the board 4.

Next, the antenna 68 is, as shown in FIG. 3, disposed at the longitudinal end of the second housing 12B on the side on which the input device 24 and the microphone 8 are disposed. The antenna 68 is disposed facing the board 4 of the second housing 12B and is connected to a part of the circuit 4A provided on the board 4. The antenna 68 may be an antenna for performing communications such as calls; that is, it may be an antenna for performing communications with the base station, or it may also be an antenna for performing communications with GPS satellites.

The earth electrode 69 is an electrode that retains the reference potential of various circuits disposed inside the housing 12. The earth electrode 69 is disposed on the surface on the first housing 12A side of the board 4. A part of the earth electrode 69 is disposed between the input device 24 on the surface of the first housing 12A side of the board 4 and the opening 62. Specifically, the earth electrode 69 is disposed at the position facing a section on the first housing 12A side of the wiring part 66. Consequently, the earth electrode 69 is disposed between the wiring part 66 and the antenna 68. Accordingly, the earth electrode 69 controls the effect of the antenna 68 on the wiring part 66.

The earth electrode 70 is an electrode that retains the reference potential of various circuits disposed inside the housing 12. The earth electrode 70 is disposed on the surface of the second housing 12B side of the board 4. A part of the earth electrode 70 is disposed between the connector 64 on the surface of the second housing 12B side of the board 4 and the opening 62. Specifically, the earth electrode 70 is disposed at a position facing a section on the second housing 12B side of the wiring part 66. Consequently, the earth electrode 70 is disposed between the wiring part 66 and the board 4. Accordingly, the earth electrode 70 can decrease the intensity of the electric field generated from the wiring part 66 and passing through the board 4.

Figure 5:
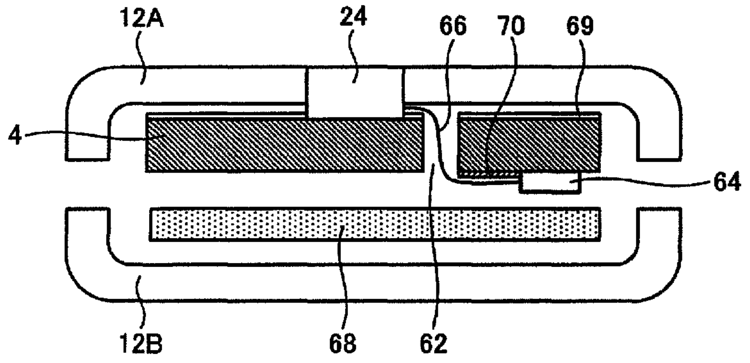
FIG. 5 is a sectional view schematically showing the relationship between a board and an input device of the mobile phone terminal.
Figure 6:
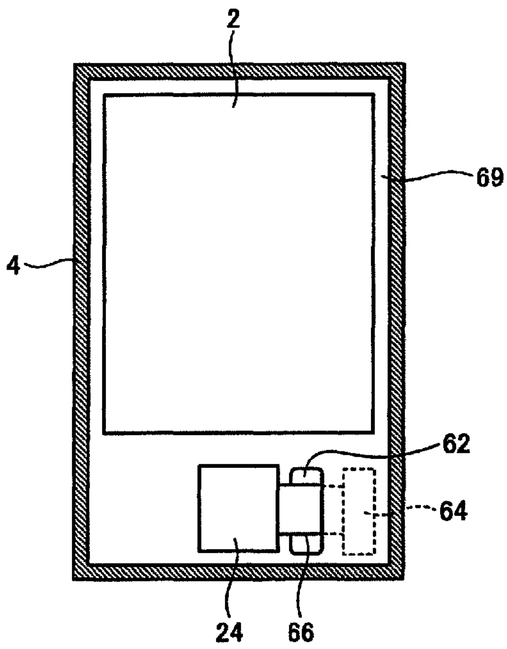
FIG. 6 is a front view schematically showing the relationship between the board and the input device of the mobile phone terminal.

Next, using FIG. 5 and FIG. 7, the relationship between the board 4 and the input device 24 of the mobile phone terminal 1 will be described. Here, FIG. 5 is a sectional view schematically showing the relationship between the board and the input device of the mobile phone terminal. FIG. 6 is a front view schematically showing the relationship between the board and the input device of the mobile phone terminal, and FIG. 7 is a rear view schematically showing the relationship between the board and the input device of the mobile phone terminal.

The mobile phone terminal 1, as shown in FIG. 5, is disposed such that the input device 24 and the antenna 68 face each other through the board 4. The wiring part 66 that transmits and receives signals between the input device 24 and the circuit 4A in addition to supplying power is disposed so as to pass through the opening 62 and be connected to the connector 64 disposed on the second housing 12B side of the board 4. Accordingly, as shown in FIG. 6 and FIG. 7, a part of the wiring part 66 is disposed on the first housing 12A side, and a part of the wiring part 66 is disposed on the second housing 12B side.

Figure 7:
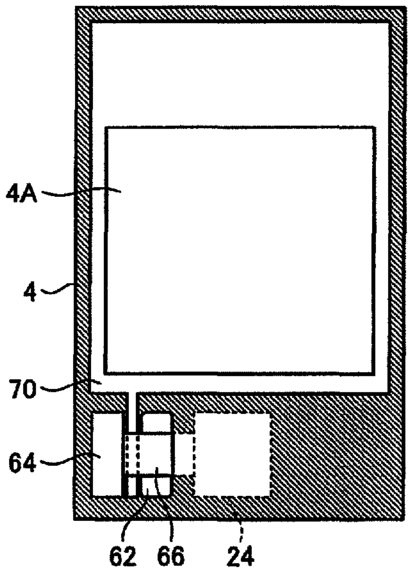
FIG. 7 is a rear view schematically showing the relationship between the board and the input device of the mobile phone terminal.

As shown in FIG. 6, the earth electrode 69 is disposed on the surface of the first housing 12A side of the board 4, and as shown in FIG. 7, the earth electrode 70 is disposed on the surface of the second housing 12B side of the board 4. Other electronic components are stacked and disposed on the earth electrode 69 and the earth electrode 70. Regarding the section of the wiring part 66 exposed to the first housing 12A side, the earth electrode 69 is disposed between the wiring part 66 and the board 4. Regarding the section of the wiring part 66 exposed to the second housing 12B side, the earth electrode 70 is disposed between the wiring part 66 and the board 4.

The mobile phone terminal 1, as above, can dispose a part of the wiring part 66 connecting to the input device 24 on the side on which the antenna 68 is disposed, by disposing the connector 64 on the second housing 12B side of the board 4, and forming the opening 62 causing the board 4 to pass through the wiring part 66, between the input device 24 and the connector 64. That is, the wiring part 66 is able to decrease the section disposed on the first housing 12A side relative to the board 4, compared to cases in which the connector 64 is disposed on the first housing 12A side of the board 4. Accordingly, the wiring part 66 is able to connect the input device 24 disposed on the first housing 12A side of the board 4 to the circuit 4A, while decreasing the size of the electric field output from the first housing 12A side (or electromagnetic waves and high-frequency current output outside). Specifically, by disposing part of the wiring part 66 on the second housing 12B side of the board 4, the distance between the wiring part 66 and the first housing 12A can be increased by at least the thickness of the board 4. Therefore, it is possible to reduce the intensity (intensity of the electric field) at which the electric field output from the wiring part 66 reaches the first housing 12A. Accordingly, by reducing the electric field output from the first housing 12A side, it is possible to reduce the electric field output from the vicinity of the input device 24 and the microphone 8. During a call, etc., it is possible to reduce the electric field (and/or high-frequency current) reaching users in the vicinity of the microphone 8. Accordingly, it is possible to further reduce the SAR (Specific Absorption Rate) as the mobile phone terminal 1.

By forming the opening 62 on the board 4, allowing the wiring part 66 to pass through the opening 62, and disposing a part of the wiring part 66 on the second housing 12B side of the board 4, as is the case with the present embodiment, it is possible to reduce the effect of the electric field generated by the wiring part 66, which is intended to cause the input device 24 to function, even for the configuration in which the input device 24 is disposed on the first housing 12A side. Accordingly, even if the input device 24 is disposed in the vicinity of the antenna 68, it is possible to dispose the input device 24 without reducing the function of the antenna 68 (for example, the strength to output from the antenna 68). By being able to dispose the input device 24 at the position facing the antenna 68, each component of the device can be disposed effectively and functionally. Because it is possible to effectively utilize the surface of the board 4 facing the antenna 68, even from this perspective, it is possible to effectively utilize the space inside the housing 12. Consequently, it is possible to reduce the size and thickness of the device.

It is possible to control the wiring part 66 from being bent in the direction perpendicular to the surface of the first housing 12A due to the configuration in which the wiring part 66 is passed through the opening 62 of the board 4 and disposed over both surfaces of the first housing 12A side surface and the second housing 12B side surface of the board 4. That is, even if the wiring part 66 is long, relative to the distance between the input device 24 and the connector 64 in the direction parallel to the surface of the first housing 12A, it can prevent the wiring part 66 from being bent. By being able to control the curvature of the wiring part 66, it is possible to prevent the intensity of the electric field in which the first housing 12A is reached from becoming uneven due to design errors of the body of the mobile phone terminal 1. Accordingly, it becomes possible to easily design the device.

As is the case with the present embodiment, by disposing the earth electrode 69 at least in part between the section at which it is disposed on the first housing 12A side, relative to the board 4 of the wiring part 66, and the board 4, that is, by disposing the earth electrode 69 between the wiring part 66 and the antenna 68, it is possible to reduce the electric field output outside the first housing 12A side. Specifically, it is possible to absorb the electric field (high-frequency current) output from the antenna 68 at the earth electrode 70, thereby, reducing the electric field (high-frequency current) that reaches the section disposed on the first housing 12A side, relative to the board 4 of the wiring part 66. Accordingly, it is possible to reduce the electric field generated at the wiring part 66, due to the effect of the antenna 68, and reduce the electric field reaching the first housing 12A.

As is the case with the present embodiment, by disposing the earth electrode 70 at least in part between the section at which it is disposed on the second housing 12B side, relative to the board 4 of the wiring part 66, and the board 4, it is possible to further reduce the electric field output outside the first housing 12A side. Specifically, it is possible to absorb the electric field generated at the section disposed on the second housing 12B side, relative to the board 4 of the wiring part 66, at the earth electrode 70, and reduce the electric field, which is generated at the section disposed on the second housing 12B side, relative to the board 4 of the wiring part 66 and which reaches the first housing 12A by passing through the board 4.

Figure 8:
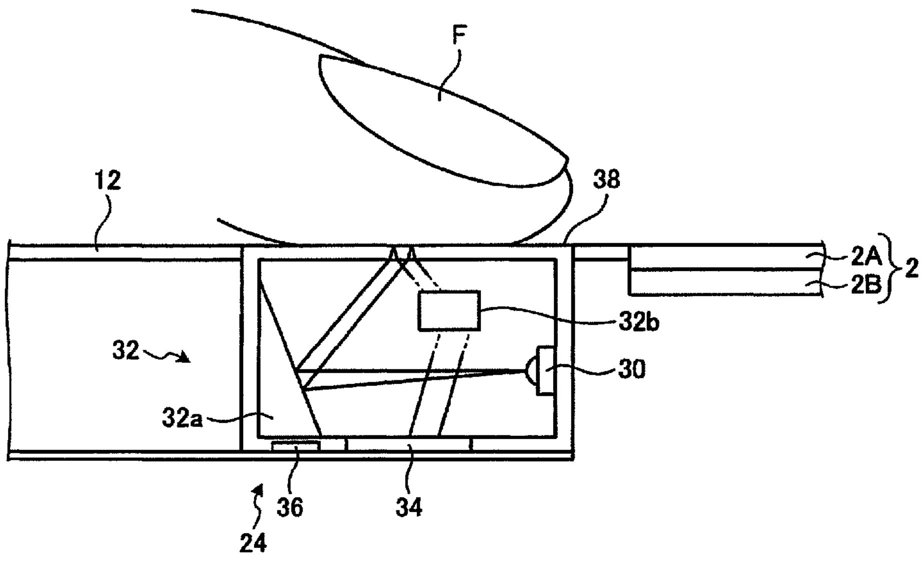
FIG. 8 is a sectional view showing the schematic configuration of the input device.
Figure 9:
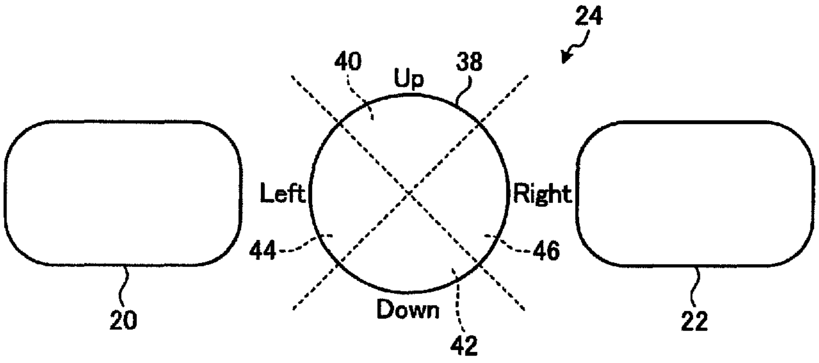
FIG. 9 is a surface view showing the schematic configuration of the input device.
Figure 10:
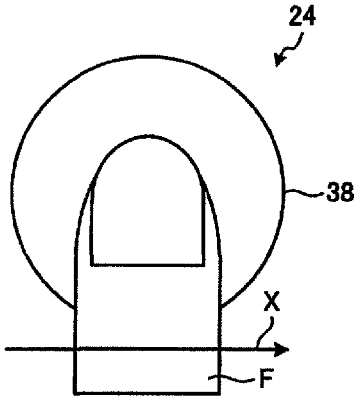
FIG. 10 is an explanatory diagram for explaining one example of an input action.

Next, using FIG. 8 to FIG. 10, the configuration of the input device 24 according to the present embodiment will be described. Here, FIG. 8 is a sectional view showing the schematic configuration of the input device, FIG. 9 is a surface view showing the schematic configuration of the input device, and FIG. 10 is an explanatory diagram for explaining one example of an input action.

The input device 24 comprises a light source 30; an optical unit 32; a sensor 34; a processing part 36; and a contact surface 38, and detects an operation input by a finger F, by detecting and analyzing the action of the finger F, which comes in contact with the contact surface 38 exposed to the surface of the housing 12. In the present embodiment, the action of the finger F was mentioned; however, an object coming in contact with the contact surface 38 that can detect changes in this contact, that is, movement, can be used as the object that inputs the operation. As is the case with the above touch panel 2, fingers, styluses, pens, etc., can be used as the object. The contact surface 38 is formed with a material that changes the characteristics of reflected light, as the object such as the finger F comes in contact with the surface. The exposed surface of the contact surface 38 is circular shaped. The touch panel 2 is disposed in the vicinity of the input device 24 and comprises the display part 2B; and the touch sensor 2A that is placed on the display part 2B.

The light source 30 is a light source that outputs light. An LED (Light Emitting Diode), a laser diode, etc., can be used as the light source. Regarding the light source, it is preferable to use a light source that outputs a constant wavelength, particularly a light source that outputs light at a wavelength within the invisible region. By using light at a wavelength within the invisible region, even if the light is irradiated outside the contact surface 38, it is possible that it will not be recognized, thereby, preventing the user from feeling too bright. Because it is possible to simplify the optical unit, it is preferable to use a light source that irradiates light with high directionality.

The optical unit 32 is a mechanism comprising an optical path that guides the light output from the light source 30 to the sensor 34, after causing it to reach the contact surface 38, and it comprises a mirror 32*a* and an optical system 32*b*. The mirror 32*a* reflects the light output from the light source 30 and deflects the light toward the contact surface 38. The optical system 32*b* comprises an optical component that condenses and refracts the light, deflecting the light reflected from the contact surface 38 towards the sensor 34.

The sensor 34 is a photo detection element that detects the light reflected from the contact surface 38. The sensor 34 comprises a planar detection surface, and acquires images of the contact surface 38 by detecting the distribution of the intensity of the light incident to each planar position. The sensor 34 transmits the detected result (image) to the processing part 36. The processing part 36 is a DSP (Digital Signal Processor), and detects the movement of the finger F, based on the detection result at the sensor 34. The processing part 36 will be described subsequently.

The input device 24 has the above configuration, and by guiding the light output from the light source 30 with the optical unit 32, the light is reflected from the contact surface 38 and then incident to the sensor 34. Subsequently, the input device 24 detects the shape of the finger F (object) coming in contact with the contact surface 38, by transmitting the information from the distribution of the light incident at the sensor 34 to the processing part 36 and analyzing the detection results. Accordingly, the input device 24 detects changes in the shape of the finger F coming in contact with the contact surface 38, that is, it detects movement and shifts of the finger F, by repeatedly detecting the shape of the finger F coming in contact with the contact surface 38, for each fixed time. The input device 24 is able to detect asperities (fingerprints, etc.) of the finger F by detecting the image of the finger F, and is able to detect shifting of the finger by detecting the shift of the characteristics thereof. FIG. 8 shows the state in which only one section of the contact surface 38 is detected; however, it is possible to acquire (detect) an image of the entire the contact surface 38, by disposing a plurality of the same unit.

Here, the input device 24, as shown in FIG. 9, is set by dividing the area of the contact surface 38 into a first area 40, a second area 42, a third area 44, and a fourth area 46. The first area 40 is an area between 315° and 45°, when the point closest to the touch panel 2 is set to 0°, centered on the center of the contact surface 38. Similarly, the second area 42 is an area between 135° and 225°. The third area 44 is an area between 225° and 315°. The fourth area 46 is an area between 45° and 135°.

For example, if a longitudinal image is set to be vertically displayed on the touch panel 2, when the input device 24 detects that the finger F (arbitrary characteristics of the finger F) has shifted from the first area 40 to the second area 42, it determines that a command to shift the operation subject, such as a cursor, downwards, was input. As shown in FIG. 10, if the finger F shifts in the X direction and the input device 24 detects that the finger F shifted from the third area 44 to the fourth area 46, it determines that a command to shift the operation subject rightwards was input. In this way, the input device 24 is able to determine in which direction, among four directions, namely, upwards, downwards, leftwards, and rightwards, the operation to shift was input, by dividing the area and detecting from which area to which area the finger moved. That is, it is possible to appropriately use the input device 24 as a direction key.

Figure 11:
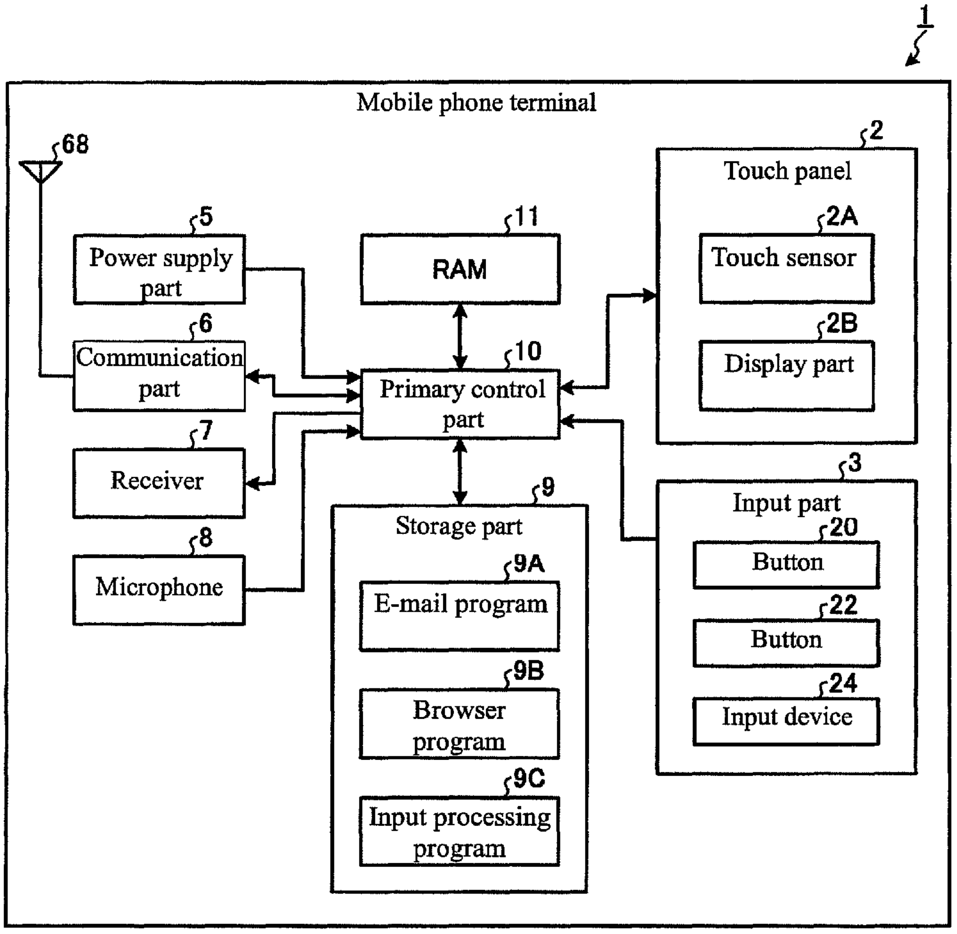
FIG. 11 is a block diagram showing the schematic configuration of the function of the mobile phone terminal.

Next, the relationship between the function and control part of the mobile phone terminal 1 is described. FIG. 11 is a block diagram showing the schematic configuration of the function of the mobile phone terminal shown in FIG. 1. As shown in FIG. 11, the mobile phone terminal 1 comprises the touch panel 2; the input part 3; a power supply part 5; a communication part 6; the receiver 7; the microphone 8; a storage part 9; a primary control part 10; and a RAM (Random Access Memory) 11.

The touch panel 2, as above, comprises the touch sensor 2A; and the display part 2B placed on the touch sensor 2A. The touch sensor 2A detects various actions performed with respect to the touch panel 2, using the finger, together with the position on the touch panel 2 at which the action is performed. The actions detected by the touch sensor 2A comprise the action in which the finger is brought in contact with the surface of the touch panel 2, the action in which the finger is shifted while the finger maintains contact with the surface of the touch panel 2, and the action in which the finger is released from the surface of the touch panel 2. The touch sensor 2A may use any detection method, such as a pressure sensitive method or an electrostatic method. The display part 2B, for example, comprises an LCD (Liquid Crystal Display), an organic EL (Organic Electro-Luminescence), etc., and displays characters, figures, images, etc.

For example, the mobile phone terminal 1 displays a virtual keyboard on the touch panel 2, in order to receive character inputs from the user. The mobile phone terminal 1 is able to detect various actions input to the touch panel 2 with the finger, in the state in which the virtual keyboard is displayed on the touch panel 2, and is able to input characters by detecting which keys from the virtual keyboard are pressed and brought into contact, setting the keys detected to have been pressed and brought into contact as input keys. The touch panel 2 detects the inputs of various operations, based on the image displayed and various actions performed with respect to the touch panel 2 with the finger, regardless of the input of characters, and performs various controls, based on the operations input.

As above, the input part 3 comprises the buttons 20 and 22; and the input device 24. The buttons 20 and 22 receive the operation physically input (pressed) by the user and then transmit signals corresponding to the received operation. The input device 24 detects the shift of the finger, etc. coming in contact with the contact surface 38, generates operation signals corresponding to this detection result, and transmits the generated signals to the primary control part 10.

The power supply part 5 supplies electric power obtained from a storage battery or an external power supply to each function part of the mobile phone terminal 1, comprising the primary control part 10. The communication part 6 establishes wireless signal lines with the base station, through channels allocated by the base station, using the CDMA method, etc., and performs telephone communications and information communications with the base station. The receiver 7 outputs sounds, ringtones, etc., of the intended party as telephone communications. The microphone 8 converts the sound of the users, etc., into electrical signals.

The storage part 9 is, for example, nonvolatile memory or magnetic storage, and stores programs and data used for processing in the primary control part 10. Specifically, the storage part 9 stores an e-mail program 9A for transmitting and receiving, as well as viewing e-mails; a browser program 9B for viewing WEB pages; and an input processing program 9C that determines the action and processing of a text edit, based on the input operation input to the input device 24. Stored in the storage part 9 are an operating system program that achieves the basic functions of the mobile phone terminal 1, and other programs and data, such as address book data, in which names, telephone numbers, e-mail addresses, etc., are registered. Stored in the storage part 9 are programs, etc., that determine the control action and processing, based on the input operation input to the touch panel 2. The control action and processing comprise various actions and processing executed at the mobile phone terminal 1, and examples include the shift of cursors and pointers, display switch of the screen, character input processing, start-up processing and end processing of various applications.

The primary control part 10 is, for example, a CPU (Central Processing Unit), and integrally controls the action of the mobile phone terminal 1. Specifically, the primary control part 10 executes programs stored in the storage part 9, by referring to data stored in the storage part 9 as necessary, and executes various processing by controlling the touch panel 2, the input part 3, the communication part 6, etc. The primary control part 10 deploys data obtained/generated/processed by executing programs and processing stored in the storage part 9 to a RAM 11 that provides temporary storage area, as necessary. Programs and reference data referred to by the primary control part 10 may be downloaded from a server device with wireless communications, using the communication part 6. The functions of each part of the mobile phone terminal 1 are configured as above. The mobile phone terminal 1 performs communications with other communication terminals, based on the operation, and acquires communications and WEB pages. The mobile phone terminal 1 is able to input various operations, simply by shifting the finger, using the input device 24 as an operation part.

Figure 12:
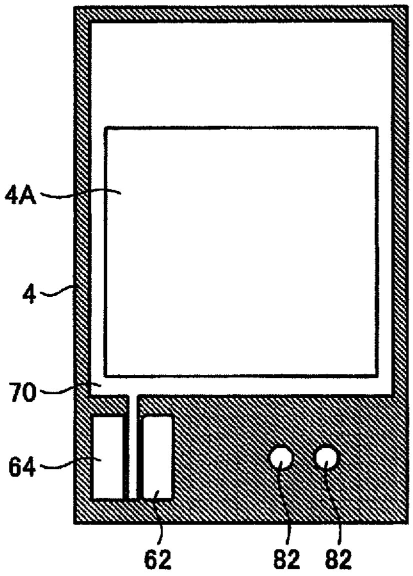
FIG. 12 is a rear view showing the schematic configuration of the board.

Here, as shown in FIG. 12, for the mobile phone terminal 1, antenna feeding points 82 are preferably disposed at the position facing the connector 64 through the opening 62. FIG. 12 is a rear view showing the schematic configuration of the board. Regarding the board 4, the antenna feeding points 82 are parts coming in contact with the antenna 68. The antenna 68 distributes electric power via the circuit (for example, the circuit 4A or other circuits) formed on the board 4, through the antenna feeding points 82. Therefore, by configuring the mobile phone terminal 1 such that the opening 62 is disposed between the antenna feeding points 82 and the connector 64, it is possible to more reliably block the current flowing through from the antenna feeding points 82 to the connector 64. Accordingly, it is possible to decrease the high-frequency current flowing to the wiring part 66, and decrease the intensity of the electric field generated at the wiring part 66.

In the above embodiment, an explanation was provided for a case of the wiring part connecting the input device to the circuit; however, the present invention is not limited to this. It is necessary to electrically connect the present invention to the circuit on the board, and it is also possible to use various electronic components not fixed to the board as the electronic device. That is, the present invention can be used as a variety of electronic devices connecting the circuit to the electronic components not fixed to the board with wiring. For example, cameras may be used as the electronic component. The subjected electronic components are disposed in the vicinity of the antenna and disposed on the side close to the surface on which the microphone or the receiver is disposed, relative to the antenna. As the electronic components, various components connected to the board with the wiring serve as subjects; however, it is preferable to use electronic components connected with the flexible printed circuit. Accordingly, the SAR can be appropriately reduced, even for cases in which the electronic components disposed in the vicinity of the antenna and disposed on the microphone and the receiver side relative to the antenna are connected to the board, using the flexible printed circuit, which can more easily generate the electric field.

As above, the electronic device according to the present invention is suitable for cases in which it is configured to comprise the antenna and the electronic components disposed at the position facing the antenna.

While at least one exemplary embodiment is presented in the foregoing detailed description, the present disclosure is not limited to the above-described embodiment or embodiments. Variations may be apparent to those skilled in the art. In carrying out the present disclosure, various modifications, combinations, sub-combinations and alterations may occur in regard to the elements of the above-described embodiment insofar as they are within the technical scope of the present disclosure or the equivalents thereof. The exemplary embodiment or exemplary embodiments are examples, and are not intended to limit the scope, applicability, or configuration of the disclosure in any way. Rather, the foregoing detailed description will provide those skilled in the art with a template for implementing the exemplary embodiment or exemplary embodiments. It should be understood that various changes can be made in the function and arrangement of elements without departing from the scope of the disclosure as set forth in the appended claims and the legal equivalents thereof. Furthermore, although embodiments of the present disclosure have been described with reference to the accompanying drawings, it is to be noted that changes and modifications may be apparent to those skilled in the art. Such changes and modifications are to be understood as being comprised within the scope of the present disclosure as defined by the claims.

Terms and phrases used in this document, and variations hereof, unless otherwise expressly stated, should be construed as open ended as opposed to limiting. As examples of the foregoing: the term "including" should be read as mean "including, without limitation" or the like; the term "example" is used to provide exemplary instances of the item in discussion, not an exhaustive or limiting list thereof; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, a group of items linked with the conjunction "and" should not be read as requiring that each and every one of those items be present in the grouping, but rather should be read as "and/or" unless expressly stated otherwise. Similarly, a group of items linked with the conjunction "or" should not be read as requiring mutual exclusivity among that group, but rather should also be read as "and/or" unless expressly stated otherwise. Furthermore, although items, elements or components of the present disclosure may be described or claimed in the singular, the plural is contemplated to be within the scope thereof unless limitation to the singular is explicitly stated. The presence of broadening words and phrases such as "one or more," "at least," "but not limited to" or other like phrases in some instances shall not be read to mean that the narrower case is intended or required in instances where such broadening phrases may be absent. The term "about" when referring to a numerical value or range is intended to encompass values resulting from experimental error that can occur when taking measurements.

The invention claimed is:

1. An electronic device comprising:

a housing;

a circuit board built inside the housing on which an opening is formed;

an antenna facing one surface of the circuit board;

electronic components disposed at the position facing the antenna through the circuit board, on the other surface of the circuit board, in a state such that the electronic components are not fixed to the circuit board; and a wiring part that passes through the opening of the circuit board, with one end connected to the electronic components on one side of the circuit board and other end connected to the circuit board on the other surface of the circuit board.

2. The electronic device according to claim 1, wherein the wiring part is a flexible printed circuit.

3. The electronic device according to claim 1, wherein a connector is disposed on the one surface of the circuit board, and the other end of the wiring part is connected to the connector.

4. The electronic device according to claim 1, wherein the circuit board includes antenna feeding points connected to the antenna on the one surface, and the opening is formed between the antenna feeding points and a connection part between the circuit board and the wiring part.

5. The electronic device according to claim 1, wherein the wiring part includes an earth electrode between a section facing one surface of the circuit board and the antenna.

6. The electronic device according to claim 1, wherein the wiring part includes an earth electrode between a section facing the other surface of the circuit board and the circuit board.

7. The electronic device according to claim 1 wherein:

the electronic components are a displacement detection part that detects displacement of an object in contact with the detection surface, comprising a detection surface exposed to the surface of the housing.

8. The electronic device according to claim 7, wherein the displacement detection part continuously acquires images of a contact surface, processes the images, and detects displacement of the characteristics of the object as the displacement of the object.

9. The electronic device according to claim 8, wherein the displacement detection part irradiates invisible light to the contact surface, acquires light reflected from the contact surface, and acquires the image of the contact surface.

10. The electronic device according to any one claim from claim 7, wherein:

the object is the tip of a finger or a rod-shaped object.

* * * * *